US009209217B2

(12) United States Patent
Maruyama et al.

(10) Patent No.: US 9,209,217 B2

(45) Date of Patent: Dec. 8, 2015

(54) IMAGE PICKUP ELEMENT AND IMAGE PICKUP DEVICE

(71) Applicant: Sony Corporation, Tokyo (JP)

(72) Inventors: Shunsuke Maruyama, Kanagawa (JP); Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/341,486

(22) Filed: Jul. 25, 2014

(65) Prior Publication Data

US 2015/0048378 A1 Feb. 19, 2015

(30) Foreign Application Priority Data

Aug. 15, 2013 (JP) ................................ 2013-168931

(51) Int. Cl.
*H01L 35/24* (2006.01)
*H01L 27/146* (2006.01)

(52) U.S. Cl.
CPC ................................ *H01L 27/1464* (2013.01)

(58) Field of Classification Search
CPC .................. H01L 27/14609; H01L 27/14614; H01L 27/1463; H01L 27/1464; H01L 27/14643; H01L 27/14689
USPC .................................................. 257/40, 431
See application file for complete search history.

(56) References Cited

U.S. PATENT DOCUMENTS

| | | | | |
|---|---|---|---|---|
| 2009/0050881 | A1* | 2/2009 | Hayashi | 257/40 |
| 2011/0032376 | A1* | 2/2011 | Takizawa | 348/222.1 |
| 2011/0149102 | A1* | 6/2011 | Toda | 348/222.1 |

FOREIGN PATENT DOCUMENTS

| | | |
|---|---|---|
| JP | 2012-004443 | 1/2012 |
| JP | 2012-129250 | 7/2012 |

* cited by examiner

*Primary Examiner* — Thanh T Nguyen

(74) *Attorney, Agent, or Firm* — Dentons US LLP

(57) ABSTRACT

Provided is an image pickup element that includes a photoelectric conversion section provided on a semiconductor substrate and including a chalcopyrite-based compound. The photoelectric conversion section has a band gap that is relatively wide on a light incident surface side.

9 Claims, 8 Drawing Sheets

IMAGE PICKUP ELEMENT AND IMAGE PICKUP DEVICE

CROSS REFERENCE TO RELATED APPLICATIONS

This application claims the benefit of Japanese Priority Patent Application JP2013-168931 filed Aug. 15, 2013, the entire contents of which are incorporated herein by reference.

BACKGROUND

The present disclosure relates to an image pickup element having a photoelectric conversion section including a chalcopyrite-based compound. The present disclosure also relates to an image pickup device including the image pickup element.

In a solid-state image pickup device such as a charge coupled device (CCD) image sensor and a complementary metal oxide semiconductor (CMOS) image sensor, a solid-state image pickup element (an image pickup element) including a photoelectric conversion section is disposed for each pixel. The photoelectric conversion section of the image pickup element may be configured of, for example, a semiconductor material such as silicon (Si). On a surface of the photoelectric conversion section, crystal defects and dangling bonds are present due to breaking of a crystal structure. The crystal defects and the dangling bonds lead to extinction, due to recombination, of an electron-hole pair generated in the photoelectric conversion section, or lead to generation of a dark current. In particular, short-wavelength light is absorbed in proximity to the surface of the photoelectric conversion section to cause generation of an electron-hole pair, and therefore is greatly affected, which leads to a decrease in sensitivity for the short-wavelength light.

On the other hand, the generation of the dark current occurs due to spreading of a depletion layer to a surface interface of the photoelectric conversion section, in addition to the presence of the crystal defects and the dangling bonds on the surface of the photoelectric conversion section. The depletion layer may be controlled by, for example, performing ion implantation in a case of Si. Therefore, for example, in a solid-state image pickup element using Si, an embedded-type photodiode, in which p-type and n-type impurity densities are controlled by ion implantation, may be used for the photoelectric conversion section. In addition, for example, in a photoelectric conversion element of Japanese Unexamined Patent Application Publication No. 2012-129250, a layer made of a material with a band gap wider than that of Si is formed on a surface of a Si layer included in a photoelectric conversion section. As a result, occurrence of an electron-hole pair at a surface of the photoelectric conversion section is suppressed.

Further, in addition to downsizing and higher sensitivity, higher image quality is demanded of the image pickup devices. To achieve the higher image quality, a decrease in generation of a dark current is necessary. For example, in a solid-state image pickup device of Japanese Unexamined Patent Application Publication No. 2012-4443, sensitivity is increased by reducing a dark current through use of a chalcopyrite-based compound semiconductor as a photoelectric conversion film on a silicon substrate.

SUMMARY

The chalcopyrite-based compound semiconductor has a considerably high optical absorption property. However, in the chalcopyrite-based compound semiconductor, it is difficult to control a depletion layer by ion implantation. Therefore, when an embedded-type photodiode is formed, a short-wavelength component that has been photoelectrically converted at the uppermost surface does not contribute as a signal due to a factor such as recombination. Hence, in this case, sensitivity for short-wavelength light (for example, blue light) is low as compared with that for other wavelength light. Moreover, sensitivity tends to vary from manufacturing to manufacturing.

It is desirable to provide an image pickup element capable of alleviating a decrease in sensitivity for a short wavelength component and variations in sensitivity, and to provide an image pickup device including the image pickup element.

According to an embodiment of the present disclosure, there is provided an image pickup element, including a photoelectric conversion section provided on a semiconductor substrate and including a chalcopyrite-based compound. The photoelectric conversion section has a band gap that is relatively wide on a light incident surface side.

In the image pickup element according to the above-described embodiment of the present technology, the photoelectric conversion section that includes the chalcopyrite-based compound has the relatively wide band gap on the light incident surface side. Therefore, absorption of short-wavelength light in proximity to a surface (light incident surface) of the photoelectric conversion section is suppressed.

According to an embodiment of the present disclosure, there is provided an image pickup device provided with an image pickup element. The image pickup element includes a photoelectric conversion section provided on a semiconductor substrate and including a chalcopyrite-based compound. The photoelectric conversion section has a band gap that is relatively wide on a light incident surface side.

According to the image pickup element and the image pickup device in the above-described embodiments of the present technology, the band gap is wide on the light incident surface side of the photoelectric conversion section configured of the chalcopyrite-based compound. Therefore, short-wavelength light is allowed to be absorbed at a position deeper than a position in proximity to a light incident surface. Accordingly, a decrease in sensitivity for a short-wavelength component and variations in sensitivity are allowed to be alleviated.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

An embodiment of the present disclosure will be described below in detail with reference to the drawings. It is to be noted that the description will be provided in the following order.

1. Embodiment (an example in which a layer with a wide band gap (a second region) is provided on a light-receiving surface of a photoelectric conversion section)
2. Modification 1 (an example in which a fixed charge film is provided on the photoelectric conversion section)
3. Modification 2 (an example in which a metal-insulator-semiconductor (MIS) structure is provided on a first region of the photoelectric conversion section)
4. Modification 3 (an example in which a transparent electrode is provided on the photoelectric conversion section)
5. Application example (an image pickup device)

1. Embodiment

Configuration of Image Pickup Element 10

Figure 1:
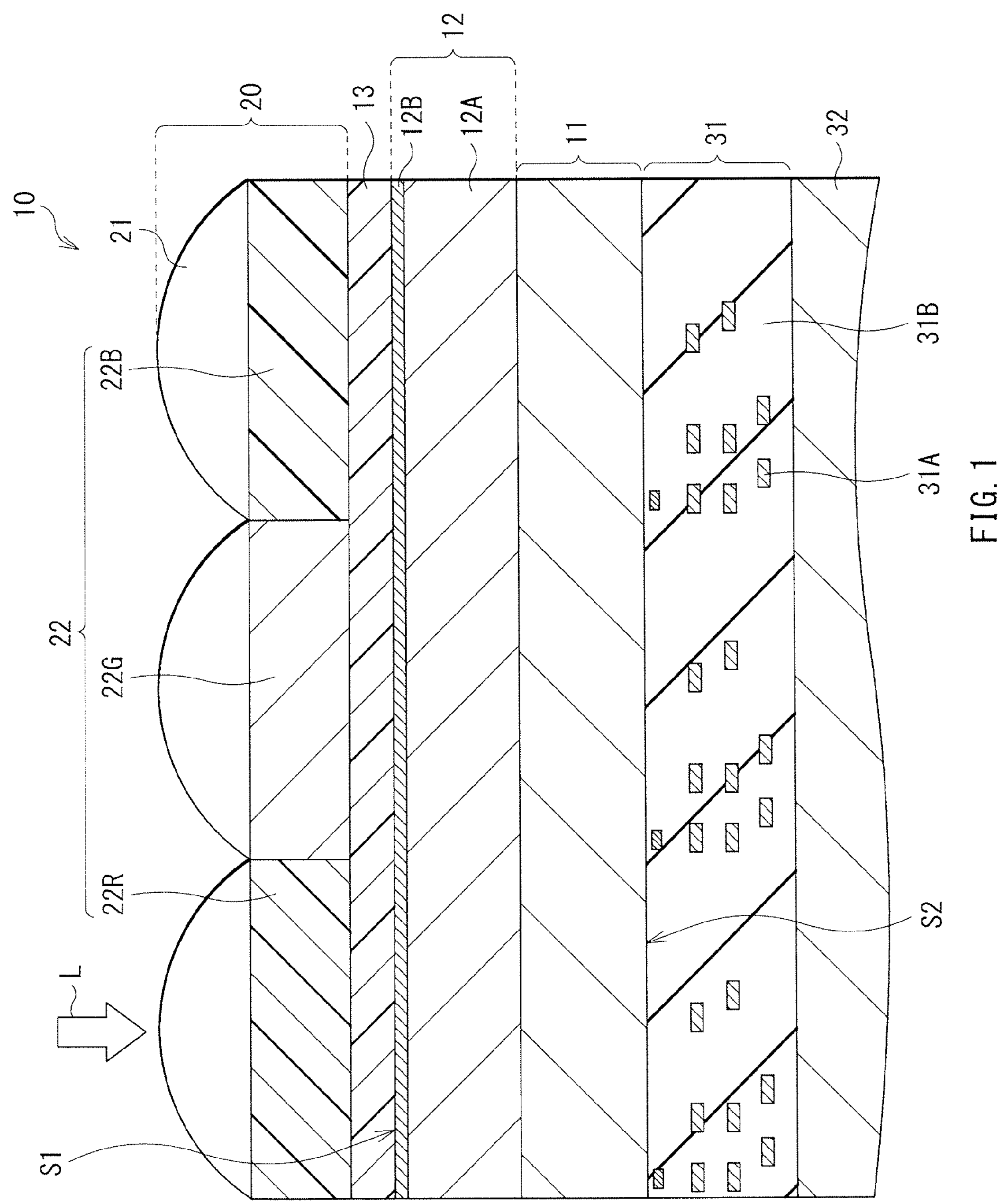
FIG. 1 is a cross-sectional diagram illustrating a schematic configuration of an image pickup element according to an embodiment of the present technology.

FIG. 1 illustrates a cross-sectional configuration of an image pickup element (an image pickup element 10) according to an embodiment of the present technology. The image pickup element 10 may form, for example, one pixel (for example, a pixel P), in an image pickup device (for example, an image pickup device 1) such as a CCD image sensor or a CMOS image sensor (see FIG. 7 for the pixel P and the image pickup device 1). The image pickup element 10 may be of a backside illumination type. The image pickup element 10 has a configuration in which a condensing section 20 and a photoelectric conversion section 12 are provided on a light incident surface side of a semiconductor substrate 11. Further, a multilayered wiring layer 31 is provided on a surface (a surface S2) of the semiconductor substrate 11, the surface being opposite to the light incident surface side.

In the image pickup element 10 of the present embodiment, for example, the photoelectric conversion section 12 of p-type may be provided on the semiconductor substrate 11 of n-type. The photoelectric conversion section 12 is formed of a chalcopyrite-based compound. The photoelectric conversion section 12 has a configuration in which a first region 12A and a second region 12B that have respective band gaps different from each other are laminated in this order from the semiconductor substrate 11 side.

Specific examples of a material of the semiconductor substrate 11 may include compound semiconductors such as cadmium sulfide (CdS), zinc sulphide (ZnS), zinc oxide (ZnO), zinc hydroxide (ZnOH), indium sulfide (InS, $In_2S_3$), indium oxide (InO), and indium hydroxide (InOH). In addition, n-type or p-type silicon (Si) may also be used.

In proximity to the surface (the surface S2) of the semiconductor substrate 11, a transfer transistor is disposed. The transfer transistor may transfer, for example, signal charge generated in the photoelectric conversion section 12, to a vertical signal line Lsig (see FIG. 7). A gate electrode of the transfer transistor may be, for example, included in the multilayered wiring layer 31. The signal charge may be either an electron or a positive hole generated by photoelectric conversion. Here, a case in which an electron is read out as the signal charge will be described as an example.

In proximity to the surface S2 of the semiconductor substrate 11, for example, components such as a reset transistor, an amplifying transistor, and a select transistor may be provided together with the above-described transfer transistor. Such transistors may each be, for example, a metal oxide semiconductor field effect transistor (MOSEFT), and included in a circuit for each of the pixels P. Each of the circuits may have, for example, a three-transistor configuration including a transfer transistor, a reset transistor, and an amplifying transistor, or may have a four-transistor configuration including a select transistor in addition to these three transistors. The transistors except the transfer transistor may also be shared by the pixels.

As described above, the photoelectric conversion section 12 has the configuration in which the first region 12A and the second region 12B having the respective band gaps different from each other are laminated. Specifically, the second region 12B has the band gap wider than that of the first region 12A, and is provided on the light incident surface side, to form a light-receiving surface (a surface S1). The first region 12A and the second region 12B may be each configured of, for example, a p-type chalcopyrite-based compound.

Figure 2:
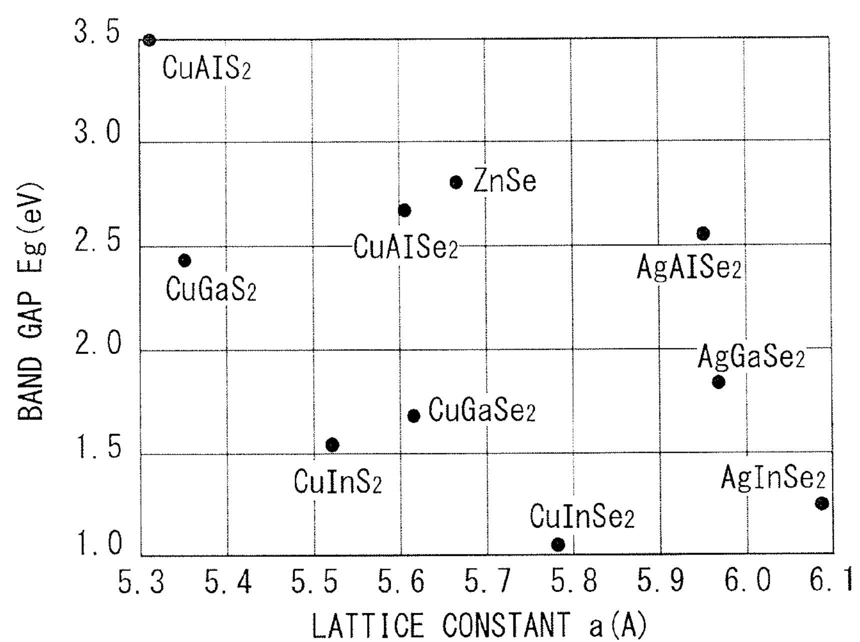
FIG. 2 is a characteristic diagram illustrating a relationship between a lattice constant and a band gap for chalcopyrite materials.
Figure 3:
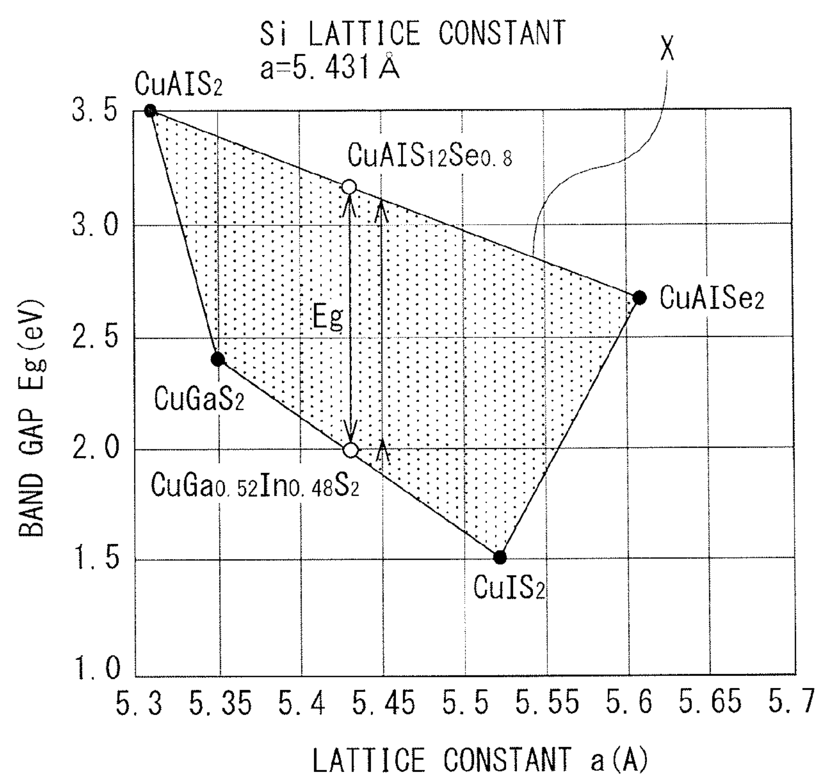
FIG. 3 is a characteristic diagram illustrating a relationship between a lattice constant and a band gap for chalcopyrite materials.

FIGS. 2 and 3 each illustrate a relationship between a lattice constant and a band gap of a chalcopyrite-based compound. As illustrated in FIG. 2, there are various chalcopyrite-based compounds. The chalcopyrite-based compound to be used in the present embodiment may be preferably one having a lattice constant close to a lattice constant of the semiconductor of the semiconductor substrate 11. This reduces crystal defects, and suppresses generation of a dark current. For example, when the semiconductor substrate 11 formed of Si is used, any of the chalcopyrite-based compounds falling within a range X illustrated in FIG. 3 may be preferably used. For example, a compound semiconductor having a chalcopyrite structure made of a crystal based on any of copper (Cu), aluminum (Al), gallium (Ga), indium (In), sulfur (S), and selenium (Se) may be used. This compound semiconductor is caused to grow epitaxially so that the photoelectric conversion section 12 having a small number of crystal defects is formed. Examples of a combination of the chalcopyrite-based compounds forming the first region 12A and the second region 12B are summarized in Table 1.

TABLE 1

| First Region | Second Region |
|---|---|
| $CuInSe_2$ | $CuInxGa_{1-x}Se_2$, or $CuGaSe_2$ |
| $CuIn_xGa_{1-x}Se2$ | Ga-rich, or $CuGaSe_2$ |
| $CuInSe_2$ | $CuInSe_yS_{2-y}$, or $CuInS_2$ |
| $CuInSe_yS_{2-y}$ | S-rich, or $CuInS_2$ |
| $CuInS_2$ | $CuIn_xGa_{x-1}S_2$, or $CuGaS_2$ |
| $CuIn_xGa_{x-1}S2$ | Ga-rich, or $CuGaS_2$ |
| $CuGaS_2$ | $CuGa_xAl_{x-1}S_2$, or $CuAlS_2$ |
| $CuGa_xAl_{x-1}S_2$ | Al-rich, or $CuAlS_2$ |
| $CuGaSe_2$ | $CuGa_xAl_{1-x}Se_2$, or $CuAlSe_2$ |
| $CuGa_xAl_{1-x}Se_2$ | Al-rich, or $CuAlSe_2$ |
| $CuAlSe_2$ | $CuAlSe_yS_{2-y}$, or $CuAlS_2$ |
| $CuAlSe_yS_{2-y}$ | S-rich, or $CuAlS_2$ |

TABLE 1-continued

| First Region | Second Region |
|---|---|
| $AgInSe_2$ | $AgInxGa_{1-x}Se_2$, or $AgGaSe_2$ |
| $AgIn_xGa_{1-x}Se_2$ | Ga-rich, or $AgGaSe_2$ |
| $AgGaSe_2$ | $AgGaxAl_{1-x}Se_2$, or $AgAlSe_2$ |
| $AgGa_xAl_{1-x}Se_2$ | Al-rich, or $AgAlSe_2$ |

It is to be noted that, in the present embodiment, the band gap of the photoelectric conversion section 12 may be varied stepwise so that the band gap on the light incident surface side becomes wide, but this is not limitative. For example, the band gap of the photoelectric conversion section 12 may be varied continuously so that the band gap on the light incident surface side becomes wide. In other words, the first region 12A and the second region 12B are in a two-layer structure (a two-layer structure of stepwise variation) made up of independent layers each having a homogeneous composition ratio as illustrated in FIG. 1, but this is not limitative. For example, the first region 12A and the second region 12B may be in a layer structure in which a composition ratio is varied continuously from the surface of the first region (the semiconductor substrate 11 side) to the surface of the second region (the light-receiving surface (the surface S1) side). In other words, the layer structure may be a laminated structure of three or more layers, in which the band gap is varied between the surfaces S1 and S2 in a multistage manner. Such a laminated structure may be adopted if this has such a configuration that the band gap on the light-receiving surface (a back surface, or the surface S1) side of the semiconductor forming the photoelectric conversion section 12 is wider than the band gap of a top surface (on the semiconductor substrate 11 side) of this semiconductor. Alternatively, a structure in which lamination of the second region 12B and the first region 12A is repeated (periodic) between the surfaces S1 and S2 may be adopted.

An electrode 13 is formed of a transparent conductive material having optical transparency, and is provided on the light-receiving surface S1 side of the photoelectric conversion section 12. The transparent conductive material may be, for example, any of indium tin oxide (ITO), indium zinc oxide (IZO), zinc oxide (ZnO), indium tin zinc oxide (InSnZnO(α-ITZO)), and an alloy of aluminum (Al) and zinc oxide (ZnO). For example, the electrode 13 may be grounded, and configured to prevent electrostatic charge due to storage of positive holes. In other words, the photoelectric conversion section 12 is interposed between the semiconductor substrate 11 serving as a lower electrode and the electrode 13 serving as an upper electrode.

As the condensing section 20, for example, an on-chip lens 21 and a color filter 22 may be provided on the electrode 13.

The on-chip lens 21 has a function of condensing light towards the photoelectric conversion section 12. Examples of a lens material may include organic materials and a silicon oxide film ($SiO_2$). In the image pickup element 10 of the backside illumination type, a distance between the on-chip lens 21 and the light-receiving surface (the surface S1) of the photoelectric conversion section 12 is made short, which suppresses variations in sensitivity of each color and color mixture that occur depending on an F-number of the on-chip lens 21.

The color filter 22 is provided between the on-chip lens 21 and the electrode 13. For example, any of a red filter (22R), a green filter (22G), and a blue filter (22B) may be disposed for each of the pixels P. These color filters 22 are provided in a regular color array (for example, a Bayer array). In the image pickup element 10, light receiving data of colors corresponding to the color array is obtained by providing the above-described color filter 22. It is to be noted that, as the color filter 22, a white filter may be provided in addition to the red filter (22R), the green filter (22G), and the blue filter (22B). Further, a flattening film may be provided between the electrode 13 and the color filter 22.

The multilayered wiring layer 31 is provided in contact with the top surface, the surface S2, of the semiconductor substrate 11, as described above. The multilayered wiring layer 31 includes a plurality of wirings 31A in an interlayer insulating film 31B. The multilayered wiring layer 31 may be, for example, adhered to a supporting substrate 32 made of Si. The multilayered wiring layer 31 is disposed between the supporting substrate 32 and the semiconductor substrate 11.

The image pickup element 10 as described above may be manufactured as follows, for example.

(Manufacturing Method)

First, the semiconductor substrate 11 including various transistors and peripheral circuits are formed. For the semiconductor substrate 11, for example, a Si substrate may be used. In proximity to the surface (the surface S2) of the Si substrate, the transistors such as the transfer transistor T1 and the peripheral circuits such as a logic circuit are formed. Next, an impurity semiconductor region is formed by ion implantation to the surface (the surface S2) side of the Si substrate. Specifically, an n-type semiconductor region is formed at a position corresponding to each of the pixels P, and a p-type semiconductor region is formed between the pixels P. Subsequently, the multilayered wiring layer 31 is formed on the surface S2 of the semiconductor substrate 11. At the multilayered wiring layer 31, the plurality of wirings 31A are formed in the interlayer insulating film 31B, and then the supporting substrate 32 is adhered to the multilayered wiring layer 31.

Next, the photoelectric conversion section 12 is formed on a back surface of the semiconductor substrate 11. Specifically, for example, the first region 12A made of $CuIn_{0.48}Ga_{0.52}S_2$ in a composition ratio may be formed using an epitaxial growth method such as molecular beam epitaxy (MBE) and metal organic chemical vapor deposition (MOCVD). Subsequently, the second region 12B of $CuGaS_2$ (or, for example, $CuGaSe_{0.61}S_{0.139}$ in a composition ratio) may be formed on the first region 12A, to have a critical film thickness or less (for example, 0.1 μm or less).

Next, on the photoelectric conversion section 12, the electrode 13 is formed, and then the color filter 22 in, for example, the Bayer array and the on-chip lens 21 may be formed in this order. The image pickup element 10 is thus completed.

(Operation of Image Pickup Element)

In the image pickup element 10 as described above, signal charge (an electron) may be obtained in the pixel P of the image pickup device as follows, for example. Upon entering the image pickup element 10 through the on-chip lens 21, light L passes through the color filter 22 (22R, 22G, or 22B) and the like and then is detected (absorbed) by the photoelectric conversion section 12 in each of the pixels P, so that red, green, or blue color light is photoelectrically converted. Of an electron-hole pair generated in the photoelectric conversion section 12, the electron moves to the semiconductor substrate 11 (for example, the n-type semiconductor region in the Si substrate) to be stored, while the positive hole moves to the electrode 13 to be discharged.

In the image pickup element 10, a predetermined electric potential VL (>0 V) is applied to the semiconductor substrate 11, while, for example, an electric potential VU (<VL) lower than the electric potential VL may be applied to the electrode 13. Therefore, in a charge storage state (an OFF state of each of the reset transistor (not illustrated) and the transfer transistor), the electron of the electron-hole pair generated in the photoelectric conversion section 12 is guided to the n-type semiconductor region of the semiconductor substrate 11 (the lower electrode) whose potential is relatively high. An electron Eg is extracted from this n-type semiconductor region and then stored in an electrical storage layer (not illustrated) through a transmission path. When the electron Eg is stored, the electric potential VL of the n-type semiconductor region conducted with the electrical storage layer varies. This variation of the electric potential VL corresponds to a signal potential.

In reading operation, the transfer transistor changes to an ON state, and the electron Eg stored in the electrical storage layer is transferred to a floating diffusion (FD, not illustrated). As a result, a signal based on an amount of the received light L may be read out to the vertical signal line Lsig through a pixel transistor (not illustrated), for example. Subsequently, the reset transistor and the transfer transistor change to the ON state, so that the n-type semiconductor region and the FD may be reset, for example, to a power supply voltage VDD.

(Functions and Effects)

As described above, downsizing, higher sensitivity, and higher image quality are demanded of image pickup devices, but to achieve these, reducing the pixel size is necessary. However, when the pixel size is reduced, it is difficult to receive a sufficient amount of light in each pixel. Therefore, efforts have been made to increase the sensitivity by, for example, using a chalcopyrite-based compound semiconductor with a high optical absorption property, as the photoelectric conversion section. However, as for the chalcopyrite-based compound, density adjustment by a method such as ion implantation is difficult and therefore, it has been difficult to control the width of the depletion layer. For this reason, depletion layer widths have greatly varied from manufacturing to manufacturing.

On the other hand, there are crystal defects and dangling bonds on the surface of the photoelectric conversion section formed of a semiconductor material. The crystal defects and the dangling bonds cause easy extinction, due to recombination, of an electron-hole pair generated in the photoelectric conversion section. Therefore, sensitivity is low for short-wavelength light (for example, blue light) that is readily absorbed in proximity to the surface of the photoelectric conversion section. In the image pickup element in which the photoelectric conversion section is formed of a chalcopyrite-based compound, this low sensitivity for the short-wavelength light has been a more serious issue than the above-described difficulty in controlling the depletion layer.

In contrast, in the image pickup element 10 of the present embodiment, the second region 12B is formed on the light incident surface side of the photoelectric conversion section 12 formed of the chalcopyrite-based compound. The band gap of the second region 12B is wider than the band gap of the first region 12A forming the surface of the photoelectric conversion section 12, the surface opposite to the light incident surface side. Therefore, absorption of light in proximity to the light-receiving surface (the surface S1) of the photoelectric conversion section 12 is suppressed. In other words, short-wavelength light is absorbed at a deep position where the amount of crystal defects and dangling bonds is small.

As described above, in the present embodiment, the second region 12B with the wide band gap is formed on the light-receiving surface (the surface S1) side of the photoelectric conversion section 12 formed of the chalcopyrite-based compound. Therefore, absorption of short-wavelength light is allowed at a position deeper than a position in proximity to the light incident surface. Accordingly, it is possible to alleviate a decrease in sensitivity for a short-wavelength component and variations in sensitivity.

Some modifications (Modifications 1 to 3) of the above-described embodiment will be described below. The same components as those of the above-described embodiment will be provided with the same reference numerals as those thereof, and will not be described as appropriate.

2. Modification 1

Figure 4:
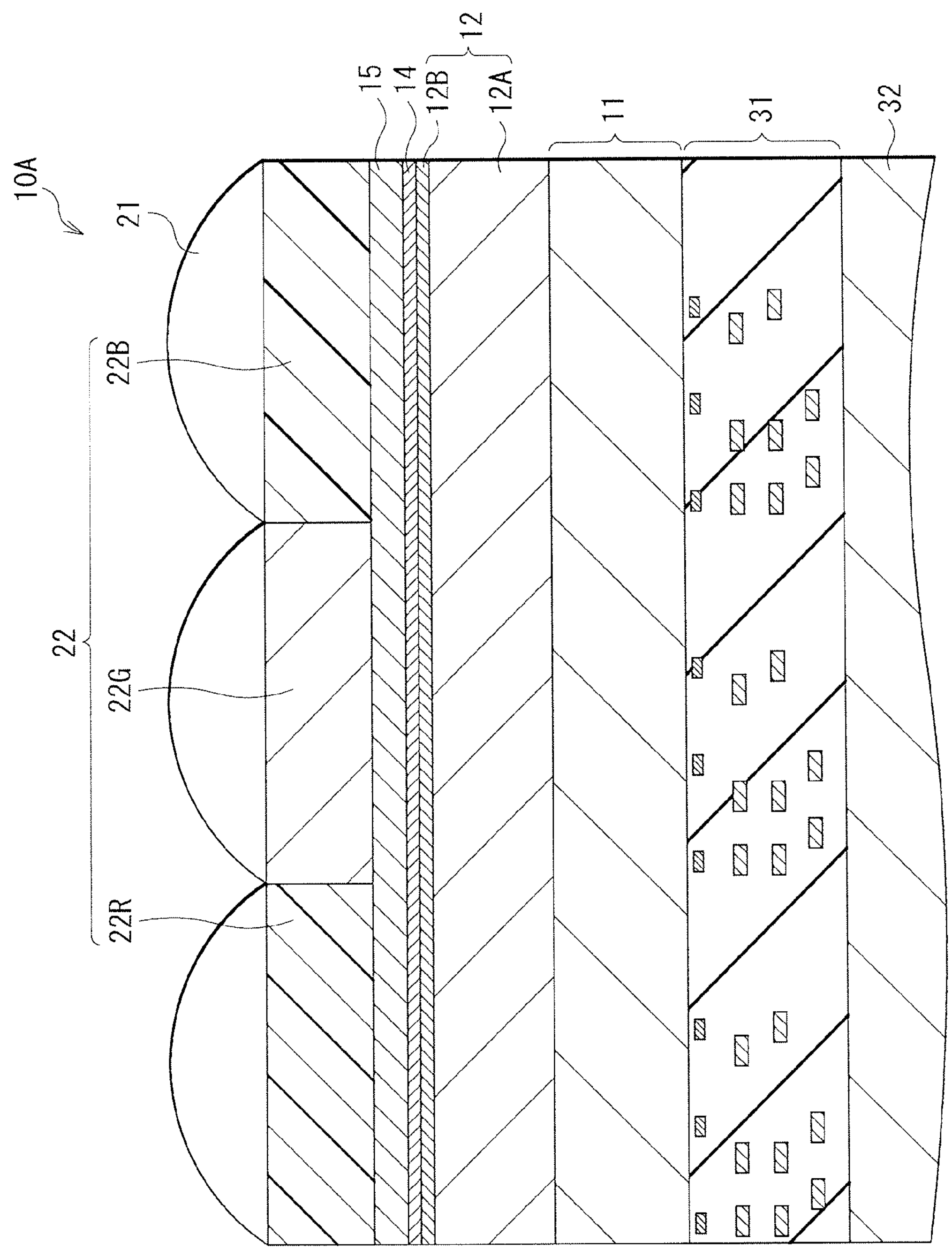
FIG. 4 is a cross-sectional diagram illustrating a configuration of an image pickup element according to Modification 1.

FIG. 4 illustrates a cross-sectional configuration of an image pickup element (an image pickup element 10A) according to Modification 1 of the above-described embodiment. In the image pickup element 10A, a fixed charge film 14 (and a protective film 15) is formed on the photoelectric conversion section 12, which is a point different from the above-described embodiment. Except this point, the image pickup element 10A has a configuration similar to that of the image pickup element 10, and has similar functions and effects as well.

The fixed charge film 14 is provided to fix electric charge (here, a positive hole) to an interface between the photoelectric conversion section 12 and the condensing section 20. As a material of the fixed charge film 14, a high dielectric material having a large amount of fixed charge may be preferably used. Specifically, examples of the material may include hafnium oxide ($HfO_2$), aluminum oxide ($Al_2O_3$), tantalum oxide ($Ta_2O_5$), zirconium oxide ($ZrO_2$), titanium oxide ($TiO_2$), magnesium oxide ($MgO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), and yttrium oxide ($Y_2O_3$). Alternatively, any of hafnium nitride, aluminum nitride, hafnium oxynitride, and aluminum oxynitride may also be used.

On the fixed charge film 14, the protective film 15 may be preferably formed. The protective film 15 may be configured of, for example, a single layer film of any of silicon nitride ($Si_2N_3$), silicon oxide ($SiO_2$), silicon oxynitride (SiON), and the like, or a laminated film of any of these materials.

In this way, in the image pickup element 10A, the fixed charge film 14 is provided on the photoelectric conversion section 12. Therefore, electric charge on the light-receiving surface (the surface S1) of the photoelectric conversion section 12 is fixed so that generation of a dark current is suppressed. As a result, an effect of being able to reduce occurrence of noise is produced, in addition to the effects in the above-described embodiment.

3. Modification 2

Figure 5:
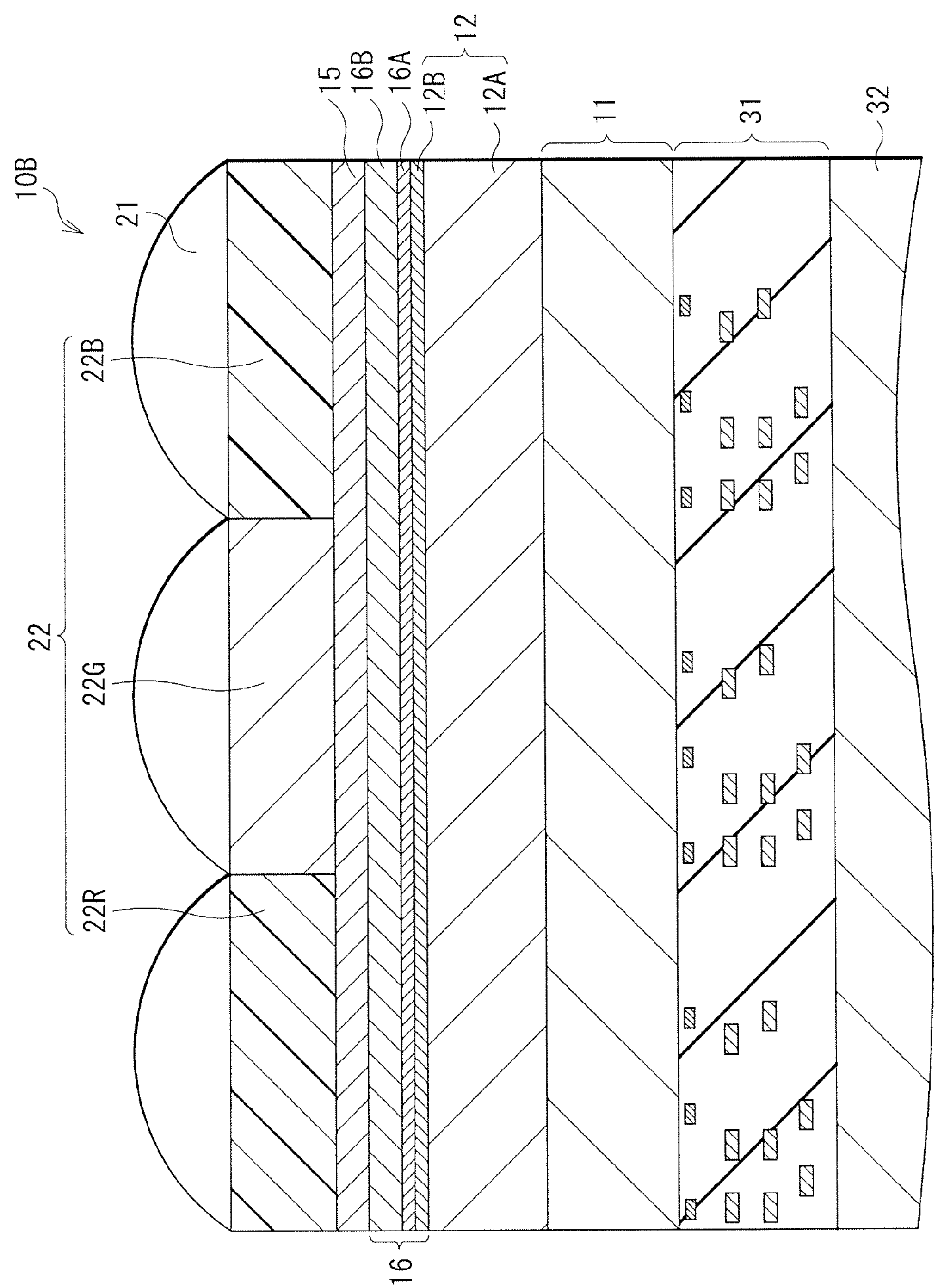
FIG. 5 is a cross-sectional diagram illustrating a configuration of an image pickup element according to Modification 2.

FIG. 5 illustrates a cross-sectional configuration of an image pickup element (an image pickup element 10B) according to Modification 2 of the above-described embodiment. In the image pickup element 10B, an insulating film 16A and an electrode 16B are provided on the photoelectric conversion section 12 and an MIS structure is formed, which is a point different from the above-described embodiment. Except this point, the image pickup element 10B has a configuration similar to that of the image pickup element 10, and has similar functions and effects as well.

The insulating film 16A may be configured of, for example, a single layer film of any of silicon nitride ($Si_2N_3$), silicon oxide ($SiO_2$), silicon oxynitride (SiON), and the like, or a laminated film of any of these materials.

The electrode 16B may be configured of, for example, a transparent conductive material such as ITO and ZnO. It is to be noted that, when the image pickup element 10B is configured as an image pickup element for infrared photography, the material of the electrode 16B may not be the transparent conductive material. For example, a simple substance or an alloy of any of metallic elements such as aluminum (Al), chromium (Cr), gold (Au) platinum (Pt), nickel (Ni), copper (Cu), tungsten (W), and silver (Ag).

On the electrode 16B, the protective film 15 may be preferably formed. The protective film 15 may be preferably configured of, for example, a single layer film of any of silicon nitride ($Si_2N_3$), silicon oxide ($SiO_2$), silicon oxynitride (SiON), and the like, or a laminated film of any of these materials.

In this way, in the image pickup element 10B, the MIS structure (a laminated structure including the second region 12B, the insulating film 16A, and the electrode 16B) is formed on the first region 12A of the photoelectric conversion section 12, so that generation of a dark current is suppressed as in the modification 1. As a result, an effect of being able to reduce occurrence of noise is produced, in addition to the effects in the above-described embodiment.

4. Modification 3

Figure 6:
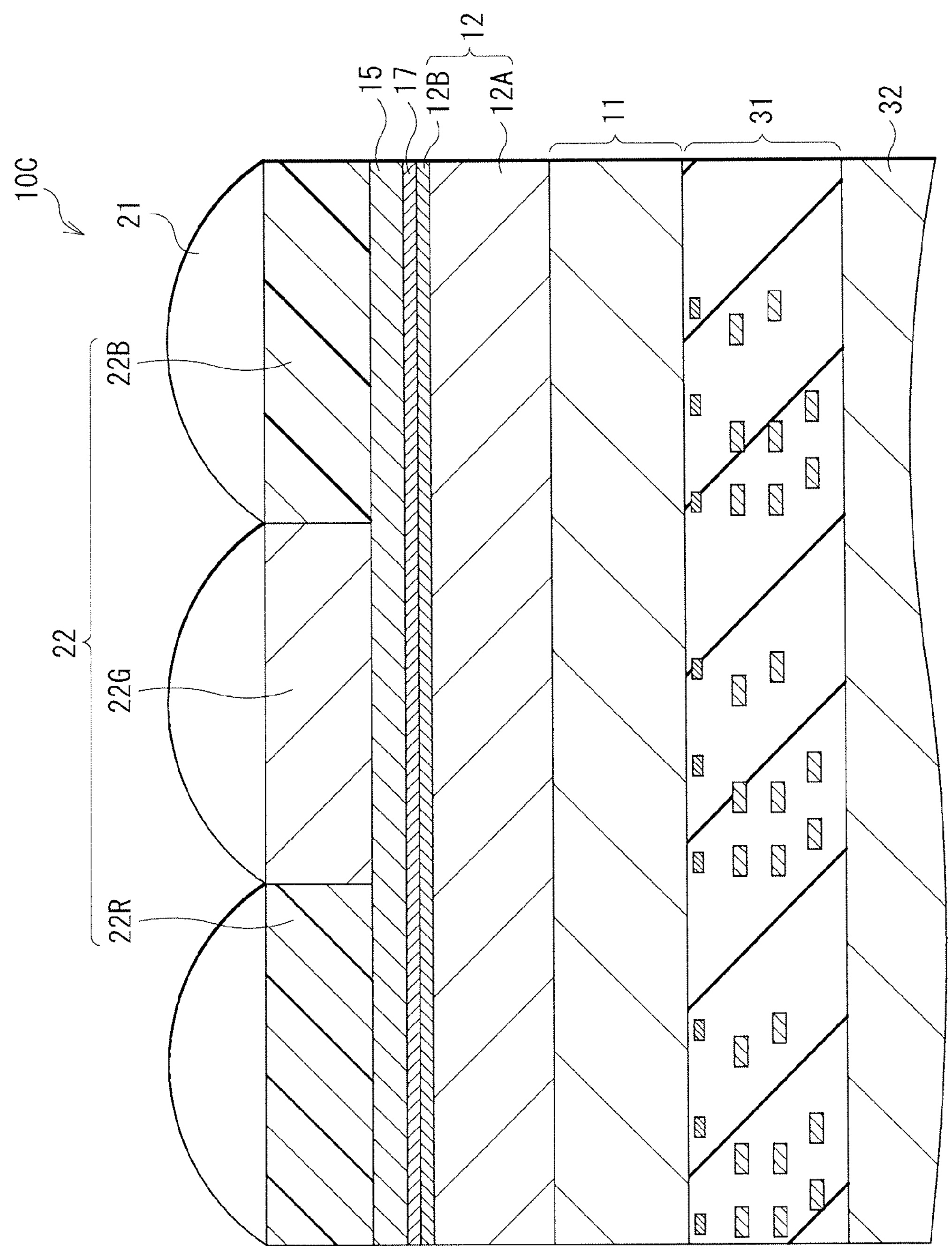
FIG. 6 is a cross-sectional diagram illustrating a configuration of an image pickup element according to Modification 3.

FIG. 6 illustrates a cross-sectional configuration of an image pickup element (an image pickup element 10C) according to Modification 3 of the above-described embodiment. In the image pickup element 10C, an electrode film 17 is formed on the photoelectric conversion section 12, which is a point different from the above-described embodiment. Except this point, the image pickup element 10C has a configuration similar to that of the image pickup element 10, and has similar functions and effects as well.

The electrode film 17 may be configured of, for example, a transparent conductive material such as ITO and ZnO.

On the electrode film 17, the protective film 15 may be preferably formed. The protective film 15 may be preferably configured of, for example, a single layer film of any of silicon nitride ($Si_2N_3$), silicon oxide ($SiO_2$), silicon oxynitride (SiON), and the like, or a laminated film of any of these materials.

In this way, in the image pickup element 10C, the electrode film 17 is formed on the photoelectric conversion section 12, so that surplus electric charge (here, a positive hole) stored on the surface (the light-receiving surface (the surface S1)) of the photoelectric conversion section 12 is allowed to be released from a back surface (the light incident surface) side. As a result, it is possible to suppress recombination of a photoelectrically converted electron. Therefore, an effect of improving quantum efficiency is produced, in addition to the effects in the above-described embodiment.

5. Application Examples

Figure 7:
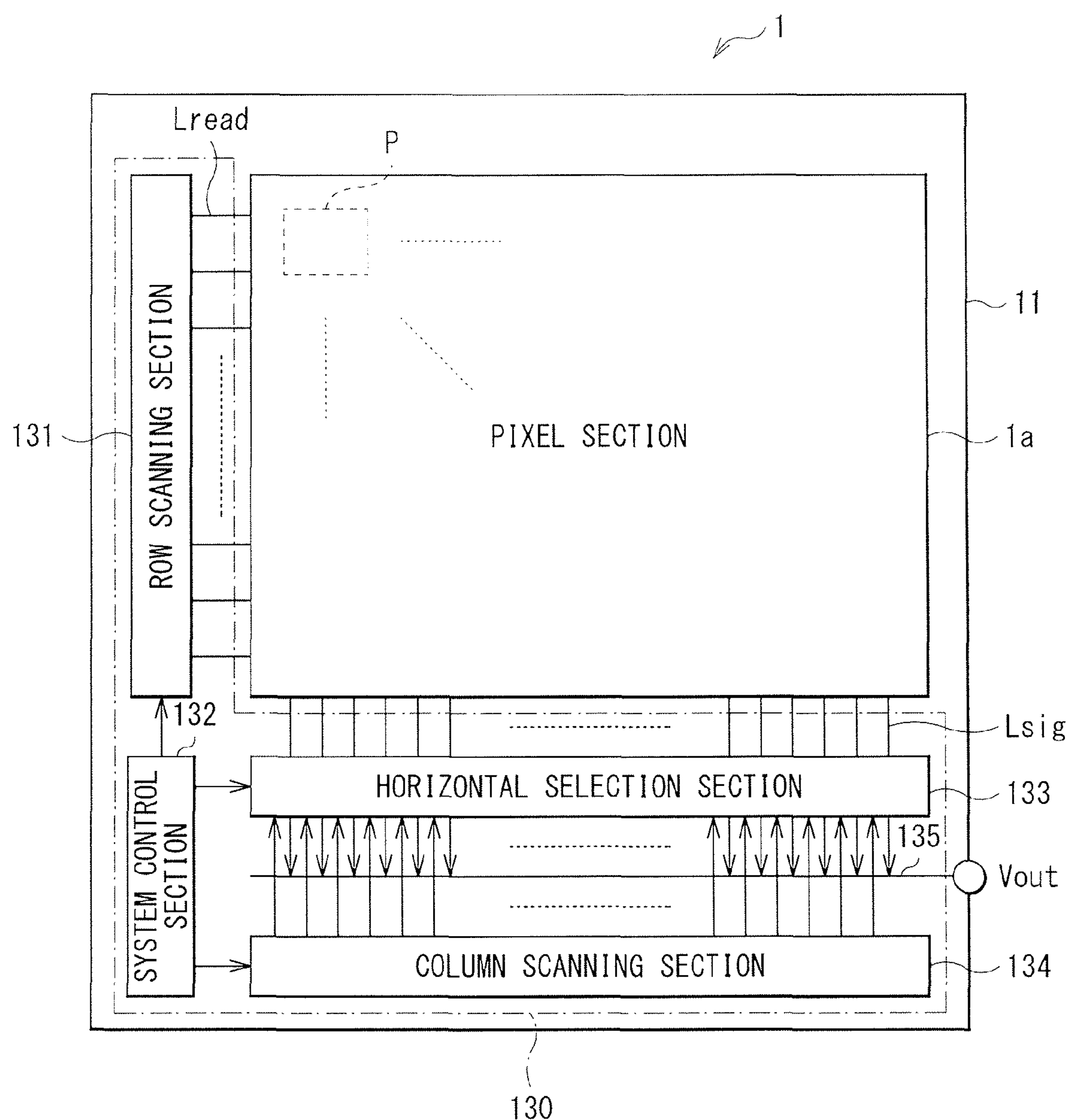
FIG. 7 is a schematic diagram illustrating an overall configuration of an image pickup device using the image pickup element illustrated in FIG. 1.

FIG. 7 illustrates an overall configuration of a solid-state image pickup device (an electronic apparatus 1) in which any of the image pickup elements (the image pickup elements 10, 10A, 10B, and 10C) of the above-described embodiment and modifications is used for each pixel. The image pickup device 1 may be a CMOS image sensor, and includes a pixel section 1*a* serving as an image pickup area, in a central part on the semiconductor substrate 11. In a peripheral region of the pixel section 1*a*, for example, a peripheral circuit section 130 including a row scanning section 131, a system control section 132, a horizontal selection section 133, and a column scanning section 134 may be provided.

The pixel section 1*a* may include, for example, a plurality of unit pixels P (each equivalent to any of the image pickup elements 10, 10A, 10B, and 10C) two-dimensionally arranged in rows and columns. To the unit pixel P, for example, a pixel driving line Lread (specifically, a row selecting line and a reset control line) may be wired for each pixel row, and the vertical signal line Lsig may be wired for each pixel column. The pixel driving line Lread transmits a drive signal for signal reading from a pixel, and has one end connected to an output terminal of the row scanning section 131, the output terminal corresponding to each row.

The row scanning section 131 includes components such as a shift register and an address decoder. The row scanning section 131 may be, for example, a pixel driving section that drives the pixels P of the pixel section 1*a* row by row. A signal outputted from each of the pixels P in the pixel row selected by the row scanning section 131 is supplied to the horizontal selection section 133 through each of the vertical signal lines Lsig. The horizontal selection section 133 may be configured of, for example, components such as an amplifier and a horizontal selection switch provided for each of the vertical signal lines Lsig.

The column scanning section 134 includes components such as a shift register and an address decoder, and drives the horizontal selection switches of the respective horizontal selection sections 133 while sequentially scanning these horizontal selection switches. By this selective scanning of the column scanning section 134, a signal of each of the pixels P transmitted through each of the vertical signal lines Lsig is sequentially outputted to a horizontal signal line 135, and then transmitted to the outside of the semiconductor substrate 11 through the horizontal signal line 135.

A circuit portion including the row scanning section 131, the horizontal selection section 133, the column scanning section 134, and the horizontal signal line 135 may be directly formed on the semiconductor substrate 11, or may be disposed in an external control IC. It is possible to provide this circuit portion in other substrate connected by a cable or the like.

The system control section 132 receives a clock provided from outside the semiconductor substrate 11 as well as data commanding an operation mode, and outputs inside information of the image pickup device 1. In addition, the system control section 132 may include, for example, a timing generator that generates various timing signals. The system control section 132 may control driving of the peripheral circuits such as the row scanning section 131, the horizontal selection section 133, and the column scanning section 134, based on the various timing signals generated by the timing generator.

Figure 8:
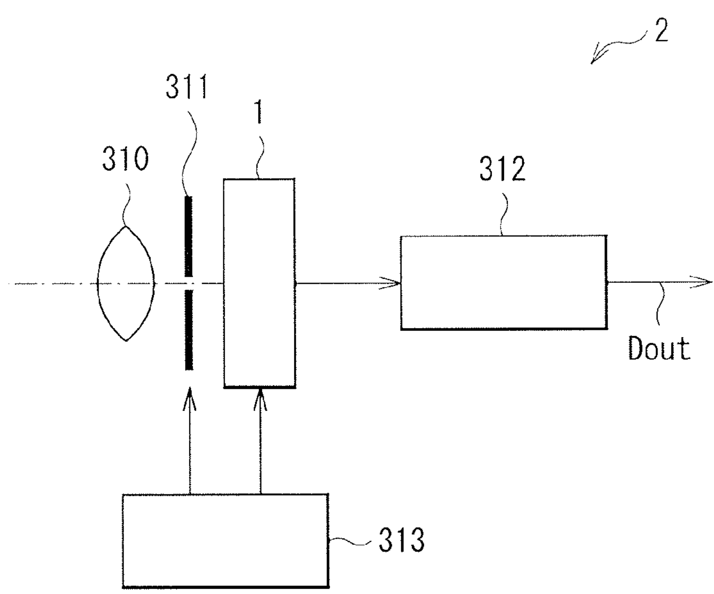
FIG. 8 is a diagram illustrating a schematic configuration of an electronic apparatus to which the image pickup device illustrated in FIG. 7 is applied.

The image pickup device 1 as described above is applicable to all types of electronic apparatuses having an image pickup function. Examples of the electronic apparatuses may include camera systems such as digital still cameras and video cameras, as well as mobile phones. As an example, FIG. 8 illustrates a schematic configuration of a camera (an electronic apparatus 2). The electronic apparatus 2 may be, for example, a video camera capable of shooting a still image or a moving image. The electronic apparatus 2 may include the image pickup device 1, an optical system (an optical lens) 310, a shutter unit 311, a signal processing section 312, and a drive section 313.

The optical system 310 guides image light (incident light) from a subject to the pixel section 1*a* of the image pickup device 1. The optical system 310 may include a plurality of optical lenses. The shutter unit 311 controls an optical irradiation period and a shielding period for the image pickup device 1. The drive section 313 controls shutter operation of the shutter unit 311 and transfer operation of the image pickup device 1. The signal processing section 312 performs various kinds of signal processing on a signal outputted from the image pickup device 1. For example, an image signal Dout after the signal processing may be stored in a storage medium such as a memory, or outputted to a unit such as a monitor.

As described above, the present technology has been described with reference to the example embodiment and Modifications 1 to 3, but the present technology is limited thereto and may be variously modified. For example, in the above-described embodiment and the like, the example in which the photoelectric conversion section 12 is formed on the back surface (the light incident surface) side of the semiconductor substrate 11 has been described. However, the photoelectric conversion section 12 may be disposed on the surface side of the semiconductor substrate 11, namely, between the semiconductor substrate 11 and the multilayered wiring layer 31. It is to be noted that, in this case, likewise, the second region 12B with the wide band gap may be preferably provided on the light incident surface side.

Further, in the above-described embodiment and the like, the configurations of the image pickup element 10, 10A, 10B, and 10C of the backside illumination type have been each taken as an example. However, the present technology is applicable to a front illumination type.

Furthermore, it is not necessary to provide all the components of the above-described embodiment and the like, and other component may be provided.

Furthermore, the technology encompasses any possible combination of some or all of the various embodiments described herein and incorporated herein.

It is possible to achieve at least the following configurations from the above-described example embodiments of the disclosure.

(1) An image pickup element, including a photoelectric conversion section provided on a semiconductor substrate and including a chalcopyrite-based compound, wherein the photoelectric conversion section has a band gap that is relatively wide on a light incident surface side.

(2) The image pickup element according to (1), wherein the photoelectric conversion section has a first region and a second region, the second region being provided on the light incident surface side and having the band gap wider than a band gap of the first region.

(3) The image pickup element according to (1) or (2), wherein the band gap of the photoelectric conversion section is varied stepwise to be wide on the light incident surface side.

(4) The image pickup element according to (1) or (2), wherein the band gap of the photoelectric conversion section is varied continuously to be wide on the light incident surface side.

(5) The image pickup element according to any one of (1) to (4), further including a fixed charge film provided on the photoelectric conversion section.

(6) The image pickup element according to any one of (1) to (4), further including an insulating film and a conductive film that are provided in this order on the photoelectric conversion section.

(7) The image pickup element according to any one of (1) to (4), further including a conductive film provided on the photoelectric conversion section.

(8) The image pickup element according to any one of (1) to (7), wherein the semiconductor substrate is configured of an n-type semiconductor.

(9) An image pickup device provided with an image pickup element, the image pickup element including a photoelectric conversion section provided on a semiconductor substrate and including a chalcopyrite-based compound, wherein the photoelectric conversion section has a band gap that is relatively wide on a light incident surface side.

It should be understood by those skilled in the art that various modifications, combinations, sub-combinations, and alterations may occur depending on design requirements and other factors insofar as they are within the scope of the appended claims or the equivalents thereof.

What is claimed is:

1. An image pickup element, comprising a semiconductor substrate;

a photoelectric conversion section on the semiconductor substrate and including a chalcopyrite-based compound; and a color filter overlaying the photoelectric conversion section, the color filter having a plurality of portions filtering different colors of light, wherein, the photoelectric conversion section has a band gap on a light incident surface side, and the photoelectric conversion section extends undivided under all of the color filter portions.

2. The image pickup element according to claim 1, wherein the photoelectric conversion section has a first region and a second region, the second region being provided on the light incident surface side and having the band gap wider than a band gap of the first region.

3. The image pickup element according to claim 1, wherein the band gap of the photoelectric conversion section is varied stepwise to be wide on the light incident surface side.

4. The image pickup element according to claim 1, wherein the band gap of the photoelectric conversion section is varied continuously to be wide on the light incident surface side.

5. The image pickup element according to claim 1, further comprising a fixed charge film on the photoelectric conversion section.

6. The image pickup element according to claim 1, further comprising an insulating film and a conductive film on the photoelectric conversion section in that order.

7. The image pickup element according to claim 1, further comprising a conductive film on the photoelectric conversion section.

8. The image pickup element according to claim 1, wherein the semiconductor substrate is comprised of an n-type semiconductor.

9. An image pickup device with an image pickup element, the image pickup element comprising:

a semiconductor substrate;

a photoelectric conversion section on the semiconductor substrate and including a chalcopyrite-based compound; and a color filter overlaying the photoelectric conversion section, the color filter having a plurality of portions filtering different colors of light, wherein, the photoelectric conversion section has a band gap on a light incident surface side, the photoelectric conversion section extends undivided under the color filter portions.

* * * * *